United States Patent [19]
Li et al.

[11] Patent Number: 6,007,169
[45] Date of Patent: Dec. 28, 1999

[54] ELECTRONIC CHASSIS AND FILTER APPARATUS AND METHOD

[75] Inventors: Hong Li, Carol Stream; Philip A. Ravlin, Bartlett; Amir Koradia, Palatine; Sajid Patel, Des Plaines, all of Ill.

[73] Assignee: 3COM. Corp., Rolling Meadows, Ill.

[21] Appl. No.: 09/144,829

[22] Filed: Aug. 31, 1998

[51] Int. Cl.⁶ .................................................. A47B 81/00
[52] U.S. Cl. .................................. 312/223.2; 312/319.1; 312/334.46; 312/333; 55/385.6
[58] Field of Search .............................. 312/223.2, 265.6, 312/333, 319.1, 334.46, 334.479, 9.11, 9.16, 9.17, 9.19, 9.21, 9.22, 9.57, 9.63; 55/506, 493, 494, 385.6, 184

[56] References Cited

U.S. PATENT DOCUMENTS

| | | | |
|---|---|---|---|
| 758,039 | 4/1904 | Andrews | 312/319.1 X |
| 1,028,767 | 6/1912 | Mooney | 312/319.1 X |
| 1,104,917 | 7/1914 | Miller | 312/333 X |
| 1,895,642 | 1/1933 | Preble | 55/493 X |
| 2,481,618 | 9/1949 | Rockhill | 312/333 X |
| 3,123,419 | 3/1964 | Maxwell | 312/333 |
| 3,328,106 | 6/1967 | Mullin | 312/334.47 X |
| 3,630,008 | 12/1971 | Revell et al. | 55/493 |
| 3,782,800 | 1/1974 | Remington et al. | 312/333 |
| 4,087,138 | 5/1978 | McRae | 312/9.22 |
| 4,270,817 | 6/1981 | McRae | 312/9.22 |
| 4,428,480 | 1/1984 | Ackeret | 312/333 X |
| 4,682,993 | 7/1987 | Todd et al. | 55/506 X |
| 5,171,183 | 12/1992 | Pollard et al. | 454/184 |
| 5,230,722 | 7/1993 | Yonkers | 55/337 |
| 5,399,180 | 3/1995 | Kopp | 55/493 |
| 5,435,837 | 7/1995 | Lewis et al. | 55/385.1 X |
| 5,514,036 | 5/1996 | Lin | 454/184 |
| 5,656,049 | 8/1997 | Diachuk | 55/493 X |

FOREIGN PATENT DOCUMENTS

| | | | |
|---|---|---|---|
| 1080134 | 6/1980 | Canada | 55/493 |
| 2019089 | 11/1971 | Germany | 312/334.47 |
| 2155712 | 3/1973 | Germany | 312/319.1 |

*Primary Examiner*—Peter M. Cuomo
*Assistant Examiner*—David E Allred
*Attorney, Agent, or Firm*—Baniak Nicholas; Pine & Gannon

[57] ABSTRACT

An electronic chassis and filter apparatus is provided. A chassis includes a top portion, a bottom portion, a first side wall portion, and a second side wall portion. The bottom portion includes an open front side, a closed back side, a first guide rail portion and a second guide rail portion. An ejector spring is operatively attached to the back side of the bottom portion, and a spring-biased actuator is operatively connected to the first rail portion adjacent the open front side. When the filter is inserted into the open front side, the filter contacts the ejector spring which biases the filter against the spring-biased actuator.

10 Claims, 4 Drawing Sheets

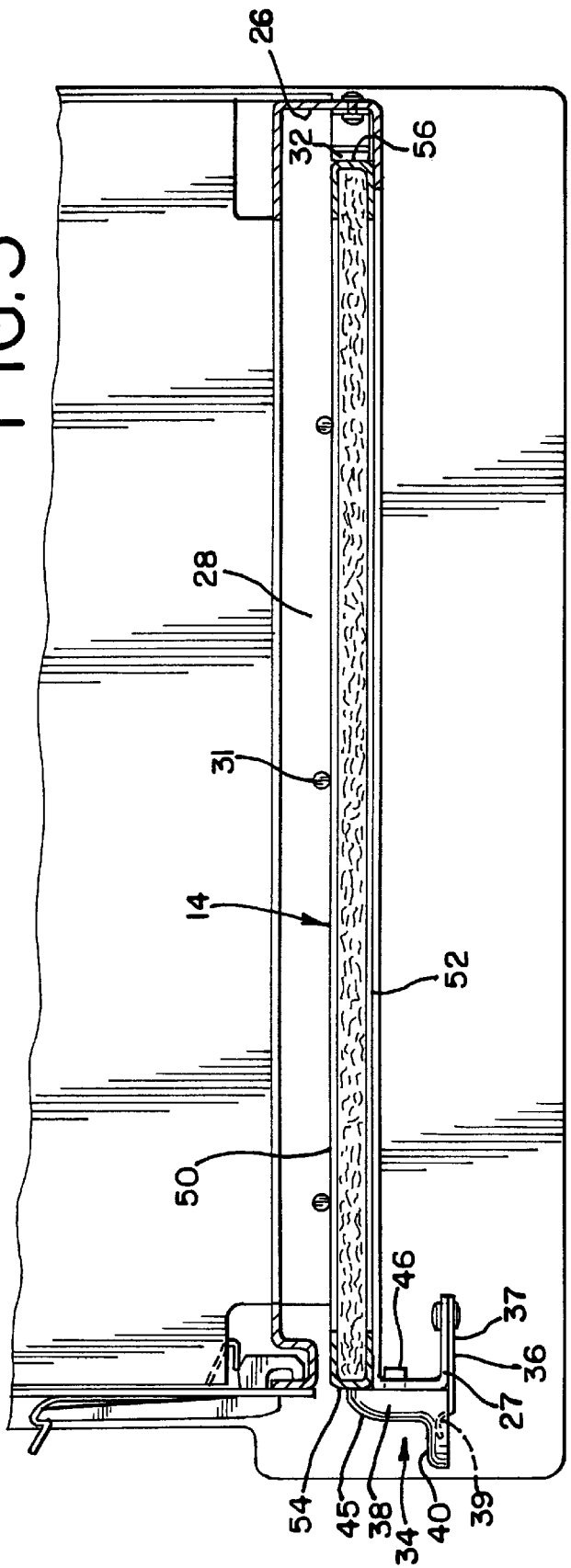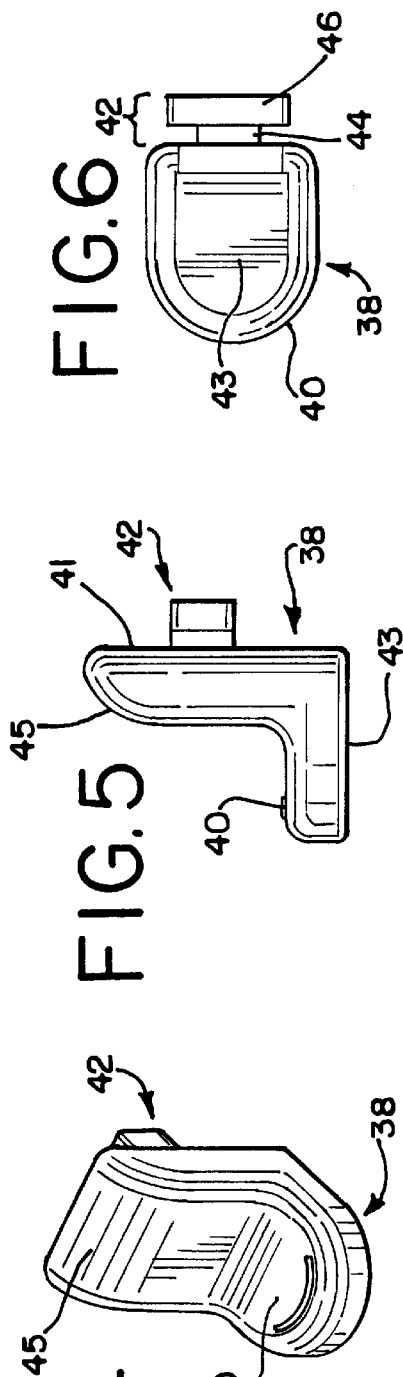

ELECTRONIC CHASSIS AND FILTER APPARATUS AND METHOD

FIELD OF THE INVENTION

This invention relates generally to the field of electronic chassis that house various electronic components. In particular, the invention relates to an electronic chassis and filter configuration which provides a convenient means to secure the filter to the chassis and to remove the filter from the chassis.

BACKGROUND OF THE INVENTION

Electronic chassis which house electronic components for high-speed telecommunication and networking applications typically include a plurality of vertically oriented application cards that are inserted into the chassis. A fan is typically located at the top of the chassis which draws air upward from the bottom of the chassis and between the application cards to provide ventilation for the various electronic components mounted on the application cards. A horizontally oriented air filter is typically inserted into a bottom portion of the chassis to prevent airborne pollutants, such as dirt particles, from entering the chassis and interfering with the electronic components housed within the chassis.

These filters are typically fastened to the chassis with conventional mechanical fastening components such as, for example, screws or bolts. However, the large number of fastening components required significantly increases manufacturing costs. Moreover, the tools that are required to tighten and release the mechanical fasteners result in inefficiencies when removing and replacing filters. The removal and installation of filters is therefore labor intensive and cumbersome, which also increases costs. Moreover, with mechanical fasteners, the tolerance between parts may result in the inconsistent placement of the filter, which in turn may cause dirt particles to enter the chassis. The same problems may arise when no mechanical fasteners are used to secure the filter to the chassis.

Finally, when the filter is installed, the outer frame of the filter is typically completely within the exterior walls of the chassis which makes it difficult to access and remove the filter. To solve this problem, attempts have been made to provide a separate handle that is attached to the frame of the filter to enable a technician to remove the filter from the chassis. This, however, also results in increased manufacturing costs.

Accordingly, it would be desirable to have an electronic chassis and filter apparatus that overcomes the disadvantages described above, and to provide a simple and cost effective electronic chassis and filter apparatus.

SUMMARY OF THE INVENTION

One aspect of the invention provides an electronic chassis and filter apparatus. An electronic chassis includes a top portion, a bottom portion, a first side wall portion, and a second side wall portion. The bottom portion includes an open front side, a closed back side, a first guide rail portion and a second guide rail portion. An ejector spring is operatively attached to the closed back side of the bottom portion. A spring-biased actuator is operatively connected to the first guide rail portion adjacent the open front side. When a filter is inserted into the open front side, the filter contacts with the ejector spring, which biases the filter against the spring-biased actuator. The spring-biased actuator may preferably be attached to a bracket portion extending from the first guide rail portion. The spring-biased actuator includes an actuator spring attached to the bracket portion. A locking member is slidably attached to the bracket portion. The locking member is biased by the actuator spring to extend the locking member to contact a first end surface of the filter and retain the filter within the bottom portion. The bracket portion preferably includes a slot formed therein for receiving a retaining tab formed on the locking member. The locking member preferably includes a manually operable portion to facilitate the operation of the spring-biased actuator. The first and second guide rails each may preferably include a plurality of guide pins spaced along a length of the first and second guide rails. The ejector spring may preferably be located adjacent the first guide rail portion.

Another aspect of the invention provides a method for operating an electronic chassis and filter apparatus. A chassis including a top portion, a bottom portion, a first side wall portion, and a second side wall portion are provided. The bottom portion includes an open front side, a closed back side, a first guide rail portion and a second guide rail portion. An ejector spring is operatively attached to the closed back side of the bottom portion. A spring-biased actuator is operatively connected to the first guide rail portion adjacent the open front side. A filter is inserted in the open front side of the bottom portion. The spring-biased actuator is deflected in a first downward direction with the filter. The ejector spring is deflected with a second end surface of the filter. The spring-biased actuator is moved in a second upward direction which is opposite the first downward direction. The filter is biased against the spring-biased actuator with the ejector spring. The filter may preferably include a frame portion having a top surface and a bottom surface. The spring-biased actuator may preferably include a locking member having an engagement surface and a locking surface. The bottom surface of the frame portion may preferably be contacted with the engagement surface during the insertion of the filter in the open front side of the bottom portion of the electronic chassis. The locking surface of the locking member may be contacted with a first end surface of the filter. The first and second guide rails may each preferably include a plurality of guide pins spaced along a length of the first and second guide rails. The top surface of the frame portion may be contacted with the plurality of guide pins. The bottom surface of the frame portion may preferably be forced against the engagement surface of the locking member. An actuator spring in communication with the locking member may preferably be deflected. The locking member may preferably include a manually operable portion. The manually operable portion of the locking member may preferably be depressed. The locking member may preferably be moved in the first downward direction until the locking surface no longer contacts the first end surface of the filter. The ejector spring may preferably be unloaded, and the filter may be ejected from the bottom portion of the chassis to enable a user to gain access to the filter.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 3 is a sectional view of the filter in the locked position;

FIG. 4 is a perspective view of the locking member;

FIG. 5 is;a side view of the locking member of FIG. 4;

FIG. 6 is a bottom view of the locking member of FIG. 4; and

DETAILED DESCRIPTION OF THE PRESENTLY PREFERRED EMBODIMENTS

Figure 1:
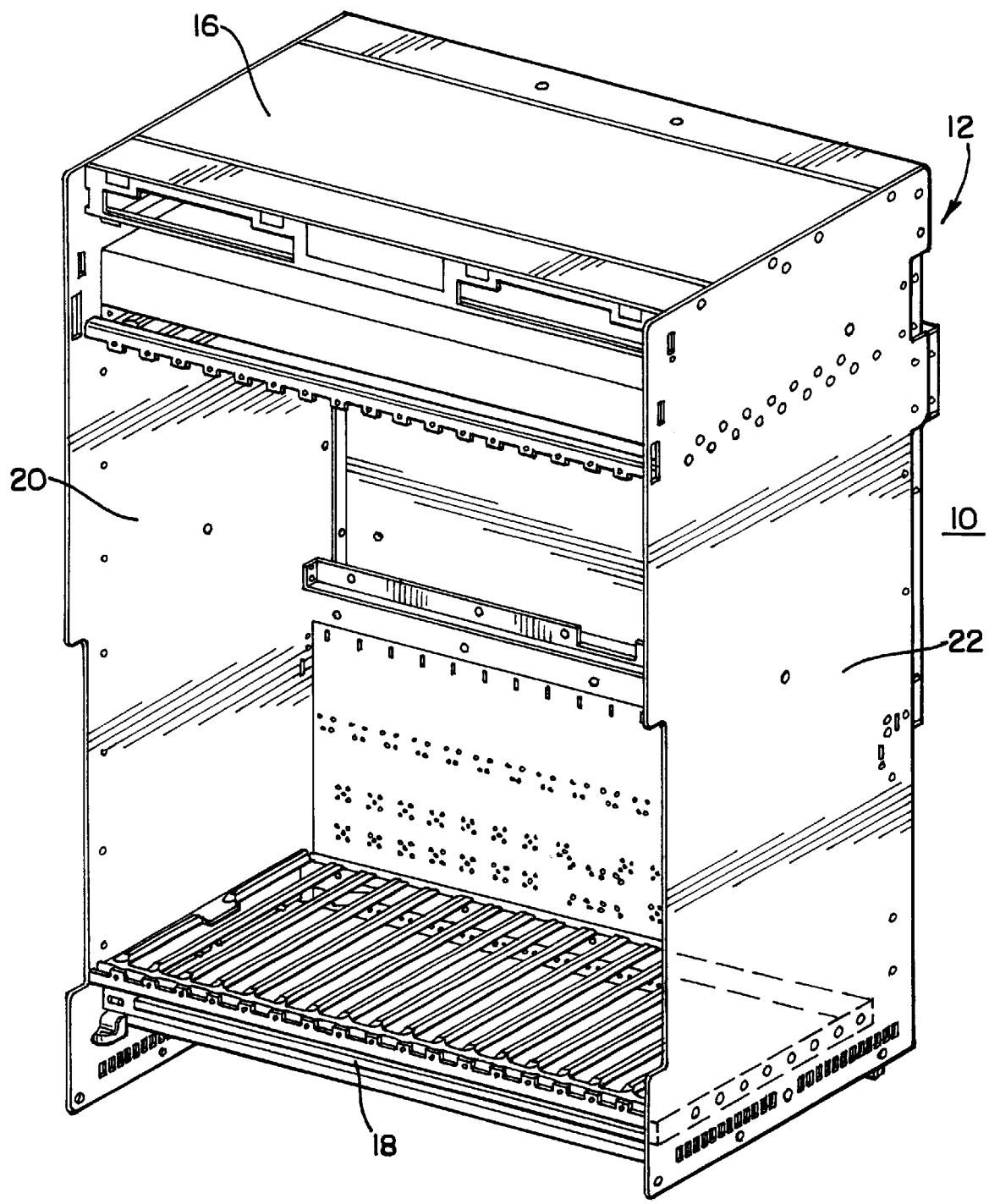
FIG. 1 is a perspective view of a preferred embodiment of an electronic chassis and filter apparatus that is made in accordance with the invention.
Figure 2:
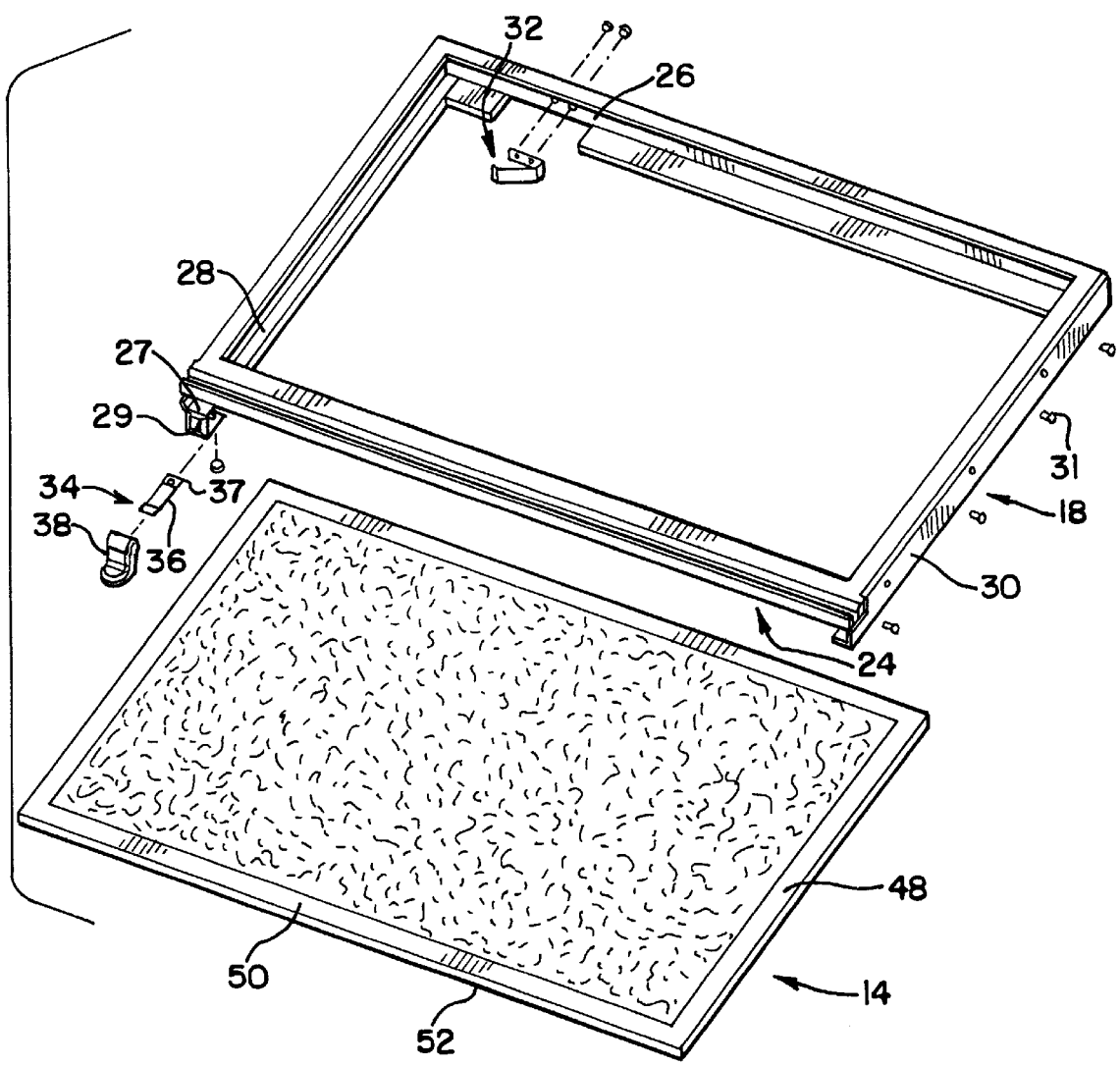
FIG. 2 is an exploded perspective view of a preferred embodiment of the filter and the bottom portion of the electronic chassis.

As shown in FIGS. 1 and 2, a preferred embodiment of an electronic chassis and filter apparatus 10 includes an electronic chassis 12 and a filter 14. The electronic chassis 12 includes a top portion 16, a bottom portion 18, a first side wall portion 20, and a second side wall portion 22. As shown in FIG. 2, the bottom portion 18 is configured to receive the filter 14. In the embodiment shown in FIG. 1, the top portion 16 and the bottom portion 18 are substantially parallel to one another. Similarly, the first side wall portion 20 and the second side wall portion 22 are substantially parallel to one another. In the embodiment shown, the top portion 16, the bottom portion 18, and the first and second side wall portions 20, 22 are configured in such a manner as to define an electronic chassis 12 having a generally rectangular shape. However, various alternative configurations of the electronic chassis 12 are contemplated. The electronic chassis 12 may be any suitable metal enclosure for housing various electronic components that carry out various functions such as, for example, telecommunications and networking functions. For example, the electronic chassis 12 may house conventional high-speed application cards, a backplane printed circuit board, and a fan tray assembly. The electronic chassis 12 may preferably be comprised of any suitable rigid metal including, for example, steel.

As shown in FIG. 2, the bottom portion 18 of the electronic chassis 12 includes an open front side 24, a closed back side 26, a first guide rail portion 28, and a second guide rail portion 30. As shown in FIG. 1, the bottom portion 18 extends between the first and second side wall portions 20, 22 adjacent the bottom of the electronic chassis 12. As shown in FIGS. 1 and 2, the open front side 24 also extends between the first and second side wall portions 20, 22 adjacent the bottom of the electronic chassis 12. The closed back side 26 of the bottom portion 18 extends between the first and second side wall portions 20, 22 opposite the open front side 24. The first guide rail portion 28 is preferably adjacent the first side wall portion 20 and extends from the open front side 24 to the closed back side 26. Similarly, the second guide rail portion 30 is preferably adjacent the second side wall portion 22 and extends from the open front side 24 to the closed back side 26. The first and second guide rail portions 28, 30 may be comprised of steel or any other suitable rigid metallic material. The first and second guide rail portions 28, 30 each may preferably have a length of approximately 10.0 inches, a width of approximately 0.50 inches, and a thickness of approximately 0.060 inches.

Figure 7:
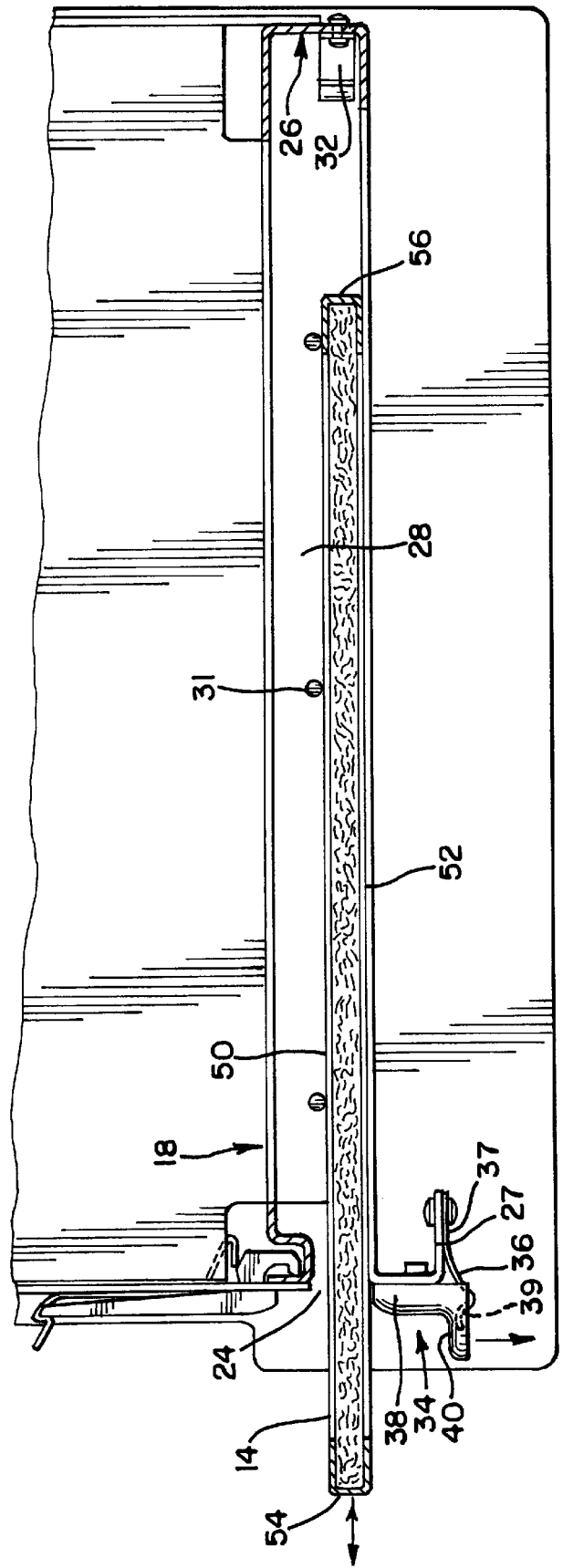
FIG. 7 is a sectional view of the filter in the ejected position.

As shown in FIGS. 2, 3 and 7, the first and second guide rail portions 28, 30 each include a plurality of guide pins 31 spaced along a length of the first and second guide rail portions 28, 30. The guide pins 31 may preferably have a generally cylindrical shape, although other shapes are contemplated.

As shown in FIGS. 2, 3 and 7, a bracket portion 27 may preferably extend from the first guide rail portion 28. In the embodiment shown, the bracket portion 27 has a generally U-shaped configuration, although alternative shapes and configurations are contemplated. The bracket portion 27 may preferably include a slot 29 formed therein. In the embodiment shown, the slot 29 has a generally rectangular shape, although other shapes may be appropriate depending upon the particular application.

As shown in FIGS. 2, 3 and 7, an ejector spring 32 is operatively attached to the closed back side 26 of the bottom portion 18 of the electronic chassis 12. The ejector spring 32 is located adjacent the first guide rail portion 28. The ejector spring 32 may be comprised of, for example, heat treated steel, or any other appropriate metallic material. The ejector spring 32 may preferably have a length of approximately 1.75 inches, a width of approximately 0.375 inches, and a thickness of approximately 0.020 inches. Alternatively, the ejector spring 32 may have other dimensions depending upon the particular application. In the embodiment shown, ejector spring 32 is formed into a generally U-shaped member. However, other shapes and configurations of the ejector spring 32 are contemplated. For example, the ejector spring 32 may be comprised of a conventional coil type spring. In the embodiment shown, one end of the ejector spring 32 is attached to the closed back side 26. Conventional mechanical fasteners such as, for example, screws, bolts, and nuts may be used to attach the ejector spring 32 to the closed back side 26. Alternatively, other conventional means may be used to fasten the ejector spring 32 to the closed back side 26 including, for example, adhesives or spot welding.

As shown in FIGS. 2, 3 and 7, a spring-biased actuator 34 is operatively connected to the first rail portion 28 adjacent the open front side 24. In the embodiment shown, the spring-biased actuator 34 is attached to the bracket portion 27. The spring-biased actuator 34 includes an actuator spring 36 and a locking member 38. The actuator spring 36 may be comprised of, for example, heat treated steel, or any other appropriate metallic material. The actuator spring 36 may preferably have a length of approximately 1.25 inches, a width of approximately 0.375 inches, and a thickness of approximately 0.020 inches. Alternatively, the actuator spring 36 may have other dimensions depending upon the particular application. In the embodiment shown, the actuator spring 36 is formed into a generally planar shaped member. However, other shapes and configurations of the actuator spring 36 are contemplated. For example, the actuator spring 36 may be comprised of a conventional coil type spring. A first end 37 of the actuator spring 36 is attached to the bracket portion 27. Conventional mechanical fasteners such as, for example, screws, bolts, and nuts may be used to attach the actuator spring 36 to the bracket portion 27. Alternatively, other conventional means may be used to fasten the actuator spring 36 to the bracket portion 27 including, for example, adhesives or spot welding.

As shown in FIGS. 4–6, the locking member 38 may preferably include a manually operable portion 40 to facilitate the operation of the spring-biased actuator 34. In the embodiment shown in FIGS. 3 and 5–7, a bottom side 43 of the manually operable portion 40 is in communication a second end 39 of actuator spring 36. The locking member 38 is biased by the actuator spring 36.

As shown in FIGS. 4–5, the locking member 38 may also preferably include an engagement surface 45 and a locking surface 41. The locking member 38 may preferably be comprised of steel, aluminum, or plastic. The locking member 38 may preferably have a length of approximately 1.00 inches, a width of approximately 0.50 inches, and a thickness of approximately 0.25 inches. In the embodiment shown, the locking member 38 has a generally L-shaped configuration. However, other shapes and configurations of the locking member 38 are contemplated.

As shown in FIGS. 4–6, the locking member 38 also may preferably include a retaining tab 42 formed thereon. Alternatively, the retaining tab 42 may be a separate member that is attached to the locking member 38. The retaining tab 42 may preferably include a stem portion 44 and a cap portion 46. In the embodiment shown in FIGS. 2–3 and 7, the locking member 38 is slidably attached to the bracket portion 27. In particular, the retaining tab 42 is inserted through the slot 29 in the bracket portion 27 and is oriented so that the cap portion 46 engages a back side of the bracket portion 27.

As shown in FIGS. 2 and 3, the filter 14 may be any of the commercially available, conventional air filters. The filter 14 may preferably include a rigid frame portion 48 that extends around the perimeter of the filter 14. The frame portion 48 may be comprised of any rigid material such as, for example, steel or aluminum. The frame portion 48 may preferably include a top surface 50 and a bottom surface 52. The filter 14 may also preferably include a first end surface 54 and a second end surface 56.

As shown in FIG. 7, in operation, a technician inserts the filter 14 into the open front side 24 of the bottom portion 18 of the electronic chassis 12. The bottom surface 52 of the frame 48 of the filter 14 contacts with the engagement surface 45 of the locking member 38. As the filter 14 is inserted, the spring-biased actuator 34 is biased with the filter 14 in a first downward direction. In particular, the bottom surface 52 of the frame portion 48 is forced against the engagement surface 45 of the locking member 38. The actuator spring 36 which is in communication with the locking member 38, is thereby deflected. As the filter 14 is inserted, the top surface 50 of the frame portion 48 contacts with the plurality of guide pins 31. In particular, the top surface 50 of the frame portion 48 slides along a bottom portion of the guide pins 31. When the filter 14 is almost completely inserted into the bottom portion 18, the ejector spring 32 is deflected with the second end surface 56 of the frame portion 48 of the filter 14. As shown in FIG. 3, when the filter 14 is completely inserted into the bottom portion 18, and the first end surface 54 of the frame portion 48 is moved beyond the engagement surface 45 of the locking member 38, the actuator spring 36 unloads. This moves the spring-biased actuator 34 in a second upward direction which is opposite the first downward direction. As a result, the locking surface 41 of the locking member 38 contacts with the first end surface 54 of the frame portion 48 of the filter 14. The filter 14 is biased against the locking surface 41 of the spring-biased actuator 34 with the ejector spring 32. An advantage of this arrangement is that a technician can easily and quickly install the filter 14 in the electronic chassis 12 without having to use separate fastening components and tools. This reduces manufacturing costs and minimizes the time required to install the filter 14.

As shown in FIG. 3, to remove the filter 14 from the electronic chassis 12, an operator depresses the manually operable portion 40 of the locking member 38. The locking member 38 is moved in the first downward direction thereby deflecting the actuator spring 36. As shown in FIG. 7, when the locking surface 41 is moved beyond first end surface 54 of the frame portion 48, the ejector spring 32 unloads. The ejector spring 32 ejects the filter 14 from the open front side 24 of the bottom portion 18 of the electronic chassis 12 to enable a technician to gain access to the filter 14. An advantage of this arrangement is that by simply depressing the manually operable portion 40, a technician can easily and quickly gain access to the filter 14 to remove the filter 14, which decreases the time required to replace filter 14.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An electronic chassis and filter apparatus comprising:
    an electronic chassis including a top portion, a bottom portion, a first side wall portion, and a second side wall portion, the bottom portion including an open front side, a closed back side, first and second guide rails connected to respective said first and second side wall portions and extending longitudinally in a fore and aft direction an ejector spring operatively attached to the closed back side of the bottom portion, a spring-biased actuator operatively connected to the first guide rail adjacent the open front side, wherein when a filter is inserted into the open front side, a second end surface of the filter contacts the ejector spring which biases the filter against the spring-biased actuator wherein the spring-biased actuator is attached to a bracket portion integrally formed with the first guide rail as a flange extending from a front end of the first guide rail, said bracket portion having an opening therein, the spring-biased actuator including an actuator spring attached to the bracket portion, and a locking member slidably received in said opening of the bracket portion, wherein the locking member is biased by the actuator spring to extend the locking member to contact a first end surface of the filter and retain the filter within the bottom portion.

2. The apparatus of claim 1 wherein the bracket portion includes said opening formed therein for receiving a retaining tab formed on the locking member.

3. The apparatus of claim 1 wherein the locking member includes a manually operable portion to facilitate the operation of the spring-biased actuator.

4. The apparatus of claim 1 wherein the first and second guide rails each include a plurality of guide pins spaced along a length of the first and second guide rails.

5. The apparatus of claim 1 wherein the ejector spring is located adjacent the first guide rail.

6. A method for operating an electronic chassis and filter apparatus comprising:
    providing a chassis including a top portion, a bottom portion, a first side wall portion, and a second side wall portion, the bottom portion including an open front side, a closed back side, a first guide rail and a second guide rail connected to said first side wall portion and said second side wall portion respectively, said guide rails extending longitudinally in a fore and aft direction, an ejector spring operatively attached to the closed back side of the bottom portion, a spring-biased actuator mounted on a bracket integrally formed with said first guide rail as a flange extending from a first end of the first guide rail adjacent the open front side said spring-biased actuator including an actuator spring attached to said bracket and a locking member slidably received in an opening in said bracket;

inserting a filter in the open front side of the bottom portion;

deflecting the spring-biased actuator in a first downward direction with the filter;

deflecting the ejector spring with a second end surface of the filter;

wherein the spring-biased actuator is moved in a second upward direction which is opposite the first downward direction; and the filter is biased against the spring-biased actuator with the ejector spring.

7. The method of claim 6 wherein the filter includes a frame portion having a top surface and a bottom surface and wherein the spring-biased actuator includes a locking member including an engagement surface and a locking surface; and contacting the bottom surface of the frame portion with the engagement surface during the insertion of the filter in the open front side of the bottom portion of the electronic chassis.

8. The method of claim 7 further comprising:

contacting the locking surface of the locking member with a first end surface of the filter.

9. The method of claim 7 wherein the first and second guide rails each include a plurality of guide pins spaced along a length of the first and second guide rails;

contacting the top surface of the frame portion with the plurality of guide pins;

forcing the bottom surface of the frame portion against the engagement surface of the locking member; and deflecting said actuator spring of the locking member.

10. The method of claim 6 wherein the locking member includes a manually operable portion;

depressing the manually operable portion of the locking member;

moving the locking member in the first downward direction until the locking surface no longer contacts the first end surface of the filter;

unloading the ejector spring; and ejecting the filter from the bottom portion of the chassis to enable a user to gain access to the filter.

* * * * *